(12) United States Patent
Lin et al.

(10) Patent No.: US 8,619,431 B2
(45) Date of Patent: Dec. 31, 2013

(54) THREE-DIMENSIONAL SYSTEM-IN-PACKAGE PACKAGE-ON-PACKAGE STRUCTURE

(75) Inventors: Nan-Chun Lin, Hukou Township, Hsinchu County (TW); Ya-Yun Cheng, Hukou Township, Hsinchu County (TW)

(73) Assignee: ADL Engineering Inc., Hsinchu County (TW)

( * ) Notice: Subject to any disclaimer, the term of this patent is extended or adjusted under 35 U.S.C. 154(b) by 149 days.

(21) Appl. No.: 12/975,698

(22) Filed: Dec. 22, 2010

(65) Prior Publication Data
US 2012/0161315 A1 Jun. 28, 2012

(51) Int. Cl.
*H05K 1/18* (2006.01)
(52) U.S. Cl.
USPC .............................. 361/762; 361/764; 361/761

(58) Field of Classification Search
USPC .................. 361/760–764, 767, 768, 776, 783
See application file for complete search history.

(56) References Cited

U.S. PATENT DOCUMENTS

| 7,319,049 B2 * | 1/2008 | Oi et al. ..................... 438/106 |
| 2005/0211465 A1 * | 9/2005 | Sunohara et al. ............. 174/260 |

* cited by examiner

*Primary Examiner* — Jenny L Wagner
(74) *Attorney, Agent, or Firm* — Kusner & Jaffe

(57) ABSTRACT

The present invention provides a three-dimensional System-In-Package (SIP) Package-On-Package (POP) structure comprising a support element formed around a first electronic device. A filling material is filled between the first electronic device and the support element. Signal channels are coupled to first die pads of the first electronic device. Conductive elements form signal connection between the first end of the signal channels and the second die pads of a second electronic device.

16 Claims, 5 Drawing Sheets

THREE-DIMENSIONAL SYSTEM-IN-PACKAGE PACKAGE-ON-PACKAGE STRUCTURE

FIELD OF THE INVENTION

This invention relates to a structure of package, and more particularly to a three-dimensional System-In-Package (SiP) Package-On-Package (POP) structure.

DESCRIPTION OF THE PRIOR ART

In the field of semiconductor devices, the device density is increased and the device dimension is reduced, continuously. The demand for the packaging or interconnecting techniques in such high density devices is also increased to fit the situation mentioned above. Conventionally, in the flip-chip attachment method, an array of solder bumps is formed on the surface of the die. The formation of the solder bumps may be carried out by using a solder composite material through a solder mask for producing a desired pattern of solder bumps. The function of chip package includes power distribution, signal distribution, heat dissipation, protection and support . . . and so on. As semiconductors become more complicated, the traditional package techniques, for example lead frame package, flex package, and rigid package technique, cannot meet the demand of producing a smaller chip with high density elements on the chip.

Typically, semiconductor devices require protection from moisture and mechanical damage. The structure involves the package technology. In the package technology, the semiconductor dies or chips are usually individually packaged in a plastic or ceramic package. The package is required to protect the die and spread the heat generated by the devices. Therefore, heat dissipation is very important in semiconductor devices, particularly as the power and the performance of the device increase.

Furthermore, conventional package technologies have to divide a dice on a wafer into respective dies and then package the die respectively. Therefore, these techniques are time consuming for the manufacturing process. The chip package technique is highly influenced by the development of integrated circuits. Therefore, as the size of electronics has become demanding, so does the package technique. For the reasons mentioned above, the trend of package technique today is toward ball grid array (BGA), flip chip (FC-BGA), chip scale package (CSP), and Wafer level package (WLP). "Wafer level package" is to be understood as meaning that the entire packaging and all the interconnections on the wafer as well as other processing steps are carried out before the singulation (dicing) into chips (dice). Generally, after completion of all assembling processes or packaging processes, individual semiconductor packages are separated from a wafer having a plurality of semiconductor dies. The wafer level package has extremely small dimensions combined with extremely good electrical properties.

WLP technique is an advanced packaging technology, by which the die are manufactured and tested on the wafer, and then singulated by dicing for assembly in a surface-mount line. The wafer level package technique utilizes the whole wafer as one object, not utilizing a single chip or die. Therefore, before performing a scribing process, packaging and testing has been accomplished. Furthermore, WLP is such an advanced technique that the process of wire bonding, die mount and under-fill can be omitted. By utilizing WLP technique, the cost and manufacturing time can be reduced, and the resulting structure of WLP can be equal to the die. Therefore, this technique can meet the demands of miniaturization of electronic devices.

Though WLP technique has the advantages mentioned above, some issues still exist influencing the acceptance of WLP technique. For example, although utilizing WLP technique can reduce the CTE mismatch between IC and the interconnecting substrate, as the size of the device minimizes, the CTE difference between the materials of a structure of WLP becomes another critical factor to mechanical instability of the structure. Furthermore, in this wafer-level chip-scale package, a plurality of bond pads formed on the semiconductor die is redistributed through conventional redistribution processes involving a redistribution layer into a plurality of metal pads in an area array type. Solder balls are directly fused on the metal pads, which are formed in the area array type by means of the redistribution process. Typically, all of the stacked redistribution layers are formed over the built-up layer over the die. Therefore, the thickness of the package is increased. This may conflict with the demand of reducing the size of a chip.

Integrated circuits and integrated circuit package systems can be found in a multitude of electronic devices, such as cell phones, pocket PCs, digital cameras, and many other portable products. Customers and electronics systems are demanding that these integrated circuit systems provide maximum functional integration of memory and logic within the smallest footprint, lowest profile, and lowest cost package available. Consequently, three-dimensional packaging is provided to achieve the required high level of functional integration necessary to support these mobile electronic products.

Various techniques have been developed to meet the continued demands for improving functional integration and circuit density within a three-dimensional package. Unfortunately, leadframe based three-dimensional packages have lagged in their ability to handle the increase in circuit density required of high level functionally integrated systems. Typically, leadframe packaging has its limit due to factors such as, increased package thickness, a larger footprint area, and insufficient input/output leads to handle the higher circuit density.

Therefore, the present invention provides a new Package-On-Package (POP) structure for reducing the package thickness and area to overcome the aforementioned problem and to also provide a better board level reliability test of temperature cycling.

SUMMARY OF THE INVENTION

The present invention provides a three-dimensional System-In-Package (SIP) Package-On-Package (POP) structure comprising at least one first electronic device with first die pads. A support element is formed around the at least one first electronic device. A filling material is filled between the at least one first electronic device and the support element. A dielectric layer is formed on the at least one first electronic device, the support element and the filling material to expose the first die pads. Signal channels are formed over the dielectric layer for coupling to the first die pads. A first protective layer is formed over the signal channels to expose the first end of the signal channels. Conductive elements are formed on the first end of the signal channels. A second electronic device has second die pads coupled to the conductive elements. A second protective layer is formed under the second electronic device to expose the second die pads of the second electronic device.

According to one aspect of the present invention, the three-dimensional System-In-Package (SiP) Package-On-Package (POP) structure further comprises a substrate with terminal pads formed thereon, and an adhesive layer formed over the substrate and under the at least one first electronic device, the support element and the filling material; bonding pads formed on the second end of the signal channels wherein the bonding pads are electrically connected to the terminal pads through wire bonds; a molding material for encapsulating the first electronic device, the second electronic device and the wire bonds; and second conductive elements formed under the substrate.

According to another aspect of the present invention, the three-dimensional System-In-Package (SiP) Package-On-Package (POP) structure further comprises ball pads formed on the second end of the signal channels wherein the ball pads are electrically connected to solder balls; a die attach formed under the first electronic device; and a third protective layer formed under the die attach, the support element and the filling material.

According to yet another aspect of the present invention, the three-dimensional System-In-Package (SiP) Package-On-Package (POP) structure further comprises a second dielectric layer formed under the first electronic device, the filling material and first part of the support element; a third protective layer formed under the second dielectric layer; backside signal channels formed under the second dielectric layer for connecting to second part of the support element; solder balls formed under the third protective layer and the backside signal channels for connecting to the backside signal channels; and a connecting layer formed on the first die pads and the second part of the support element, and under the signal channels. The bottom surface of the second part of the support element and lower surface of the second dielectric layer are coplanar.

DESCRIPTION OF THE PREFERRED EMBODIMENT

The invention will now be described in greater detail with reference to preferred embodiments of the invention and illustrations attached. Nevertheless, it should be recognized that the preferred embodiments of the invention are only for illustration. Besides the preferred embodiments mentioned here, the present invention can be practiced in a wide range of other embodiments besides those explicitly described, and the scope of the present invention is expressly not limited except as specified in the accompanying claims.

The present invention provides a newly three-dimensional System-In-Package (SiP) Package-On-Package (POP) structure for reducing the package thickness and area and for better board level reliability test of temperature cycling.

Figure 1:
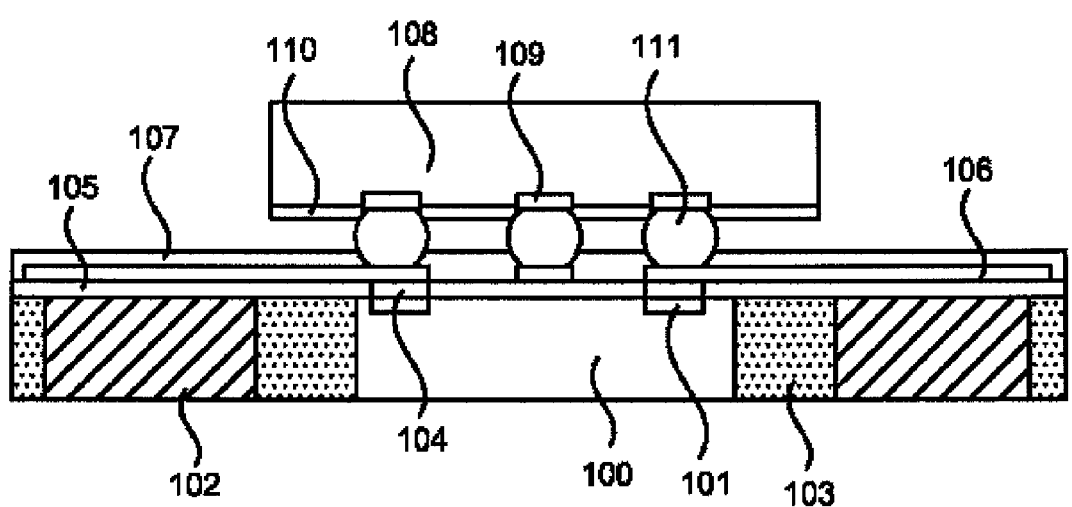
FIG. 1 illustrates a cross-sectional view of a basic three-dimensional System-In-Package (SiP) Package-On-Package (POP) structure in accordance with one embodiment of the present invention.

FIG. 1 illustrates a cross-sectional view of a basic three-dimensional System-In-Package (SiP) Package-On-Package (POP) structure in accordance with one embodiment of the present invention. As shown in the FIG. 1, the three-dimensional System-In-Package Package-On-Package structure includes a first packaged electronic element and a second electronic device, wherein the first packaged electronic element is coupled to the second electronic device through conductive elements. The second electronic device (which may be referred to as the "top" package) is located above the first packaged electronic element (bottom package), wherein an active area of the first electronic device is opposite to an active area of the second electronic device. The first packaged electronic element comprises a support element 102, a filling material 103, a first die 100, a dielectric (buffer) layer 105, a connecting layer 104, signal channels 106 and a protective layer 107. The support element 102 has predetermined die through holes and a plurality of openings passing through the support element 102, wherein the die through hole allows the first die 100 formed therein. The first die 100 has first die pads 101 formed therein for signal connection (electrical communication). In one embodiment, the support element 102 includes conductive material. The material of the support element 102 includes alloy or metal. The support element 102 is formed around the first die 100, wherein the first die 100 is an electronic (semiconductor) element. Pluralities of the die through holes and openings are created through the support element 102 from upper surface to lower surface of the support element 102. The filling material 103 is filled into the space (plurality of openings) between the first die 100 and the support element 102 and around the first die 100. For example, the filling material 103 is surrounded by the first die 100 and the support element 102. In one embodiment, the bottom and top surface of the filling material 103, the first die 100 and the support element 102 are coplanar. The dielectric (buffer) layer 105 is formed over the first die 100, the support element 102 and the filling material 103 to create a plurality of second openings for exposing the die pads 101 of the first die 100 by a photolithography process and an etching process. In one embodiment, the dielectric layer 105 comprises an elastic material, photosensitive material. The connecting layer 104 is formed on the die pads 101 of the first die 100 at the second openings and connected to the die pads 101. In one embodiment, the connecting layer 104 includes conductive material. The signal channels 106, for example redistribution layer (RDL), are formed (reflowed onto) over (upper surface of) the dielectric layer 105 and the connecting layer 104, and thereby connecting the connecting layer 104. Therefore, the connecting layer 104 is connected between the signal channels 106 and first die pads 101. In one embodiment, the signal channels 106 and the connecting layer 104 may be formed simultaneously in an identical process. In one embodiment, multiple signal channels layers (multi-RDL) can be applied to the present invention which are formed over the dielectric layer 105 and the connecting layer 104. The protective layer 107 is formed over the signal channels 106 for protection and covering the signal channels 106 and the dielectric layer 105 to form a plurality of third openings for exposing the first end of the signal channels 106. The second die 108 locates above the first die 100. For example, the first die 100 and the second die 108 are semiconductor elements. Another protective layer 110 is formed under second die 108 for protection to form a plurality of fourth openings for exposing second die pads 109 of the second die 108. The active side of the second die 108 faces downwardly. In one embodiment, material of the protective layers 107, 110 comprises SINR, silicone rubber, and the protective layers may be formed by a molding or gluing method (dispensing or printing). For product consideration, other signal channels (not shown), for example a redistribution layer (RDL), can be optionally formed over (upper surface of) the protective layer 110 and under the second die 108, thereby coupling between the second die pads 109 and the conductive elements 111. Conductive elements 111, for example solder bumps/balls, are formed on the first end of the signal channels 106 at the third openings and under the second die pads 109 at the fourth openings for signal connection, and thereby connecting between the second die pads 109 of the second die 108 and the first end of the signal channels 106. Accordingly, the first die 100 is coupled to the second die 108 through the conductive elements 111 to form a three-dimensional integrated circuit package structure.

Figure 2:
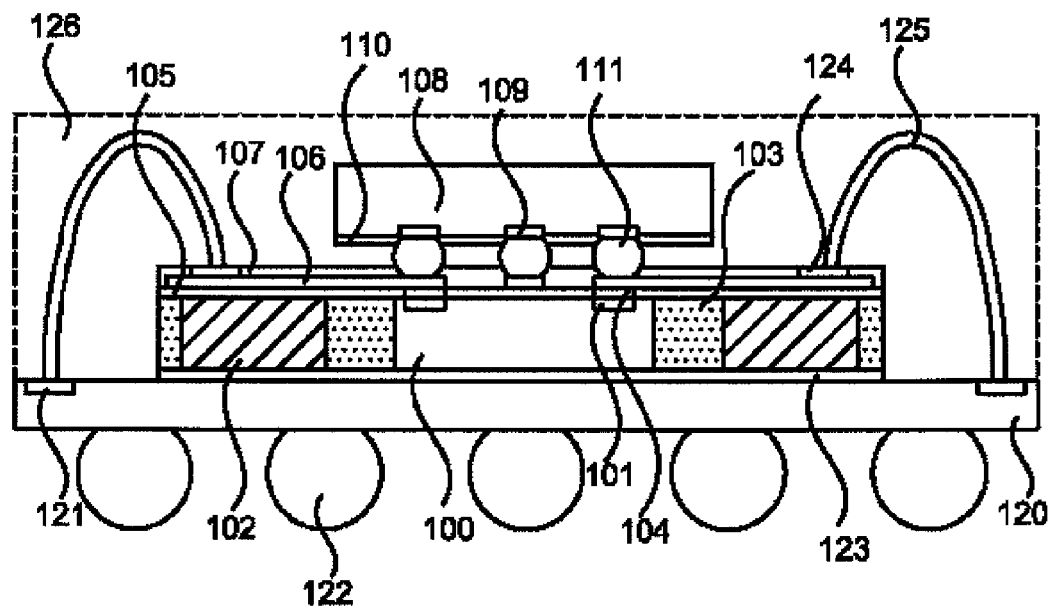
FIG. 2 illustrates a cross-sectional view of a three-dimensional System-In-Package (SiP) Package-On-Package (POP) structure with wire bonds and signal channels in accordance with one embodiment of the present invention.

FIG. 2 illustrates a cross-sectional view of a three-dimensional System-In-Package (SiP) Package-On-Package (POP) structure with wire bonds and signal channels in accordance with one embodiment of the present invention. As shown in the FIG. 2, the three-dimensional SiP POP structure includes a basic three-dimensional Package-On-Package structure of FIG. 1, bonding pads 124, wire bonds 125, a molding material 126, terminal pads 121, a package attach 123, conductive elements 122 and a substrate 120. In this embodiment, the protective layer 107 is formed over the signal channels 106 for protection and covering the signal channels 106 and the dielectric layer 105 to form a plurality of openings for exposing the first end and the second end of the signal channels 106. The first end of the signal channels 106 is connected to the conductive elements 111 and the connecting layer 104, and the second end of the signal channels 106 is connected to the bonding pads 124. The bonding pads 124 are formed on the second end of the signal channels 106. One terminal of the wire bonds 125 is located on (connected to) the terminal pads 121 of the substrate 120 for electrical connection, and the other terminal of the wire bonds 125 is located on (connected to) the bonding pads 124 of the first package electronic element. In other words, the bonding pads 124 of the lower package structure are electrically connected to the terminal pads 121 on the substrate 120 through wire bonds 125. The terminal pads 121 are formed in/on the substrate 120. For example, the terminal pads 121 are located at sides of the first packaged electronic element and the second electronic device for facilitating the first die 100 wire bonding onto wire bond sites on the upper side of the substrate 120 to establish electrical connections. The package attach 123, for example adhesive material, is formed over the substrate 120 and under the first die 100, the support element 102 and the filling material 103 at a predetermined thickness for adhering the first packaged electronic element to the substrate 120. For example, the package attach 123, typically referred to as the package attach epoxy, comprises conductive material (metal or alloy) for electric conduction, glue material, ceramic material or copper paste. Area of the package attach 123 is approximately that of the first packaged electronic element. Conductive elements 122, for example solder bumps/balls, are formed under the substrate 120 for signal connection. The first packaged electronic element, the second electronic device and the wire bonds 125 on the substrate 120 are encapsulated with the molding material (compound) 126 that provides protection from ambient and from mechanical stress to facilitate handling operations, and provides a surface for marking for identification. Reference may be made to FIG. 1 for the detailed description of the parts of the three-dimensional Package-On-Package structure of FIG. 2.

Figure 3:
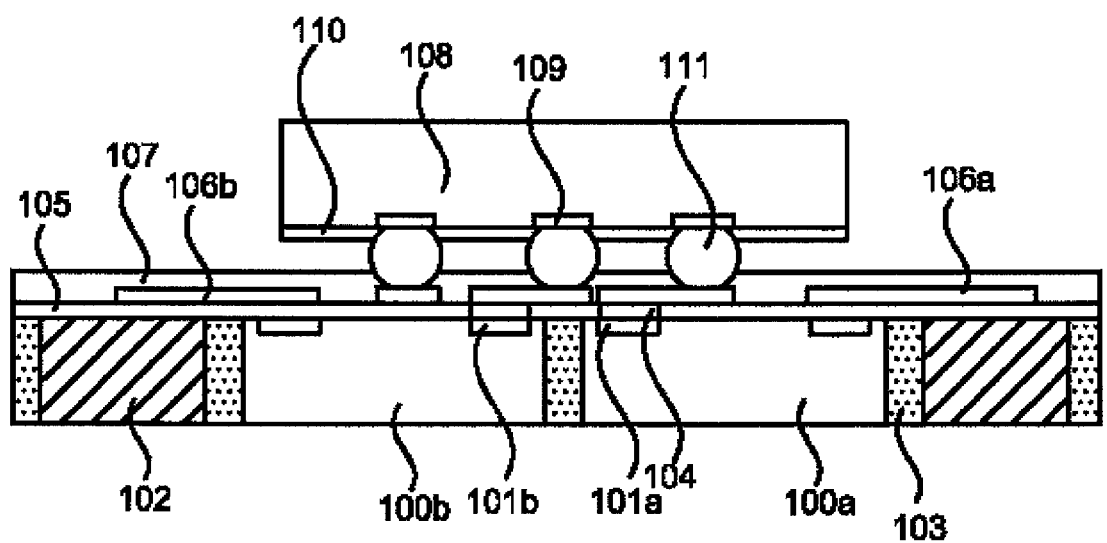
FIG. 3 illustrates a cross-sectional view of a three-dimensional System-In-Package (SiP) Package-On-Package (POP) structure with side by side signal channels in accordance with one embodiment of the present invention.

FIG. 3 illustrates a cross-sectional view of a three-dimensional System-In-Package (SiP) Package-On-Package (POP) structure with side by side signal channels in accordance with one embodiment of the present invention. In such embodiment, the first packaged electronic element comprises two first die 100a and 100b, wherein the first die 100a and the first die 100b are arranged in a side by side configuration. The signal channels 106a and 106b, for example redistribution layer (RDL), are also arranged in a side by side configuration. The first die 100a, 100b has first die pads 101a, 101b formed therein for signal connection (electrical communication), respectively. Most of the parts of the FIG. 3 are similar to FIG. 1, and therefore the detailed descriptions are omitted.

Figure 4:
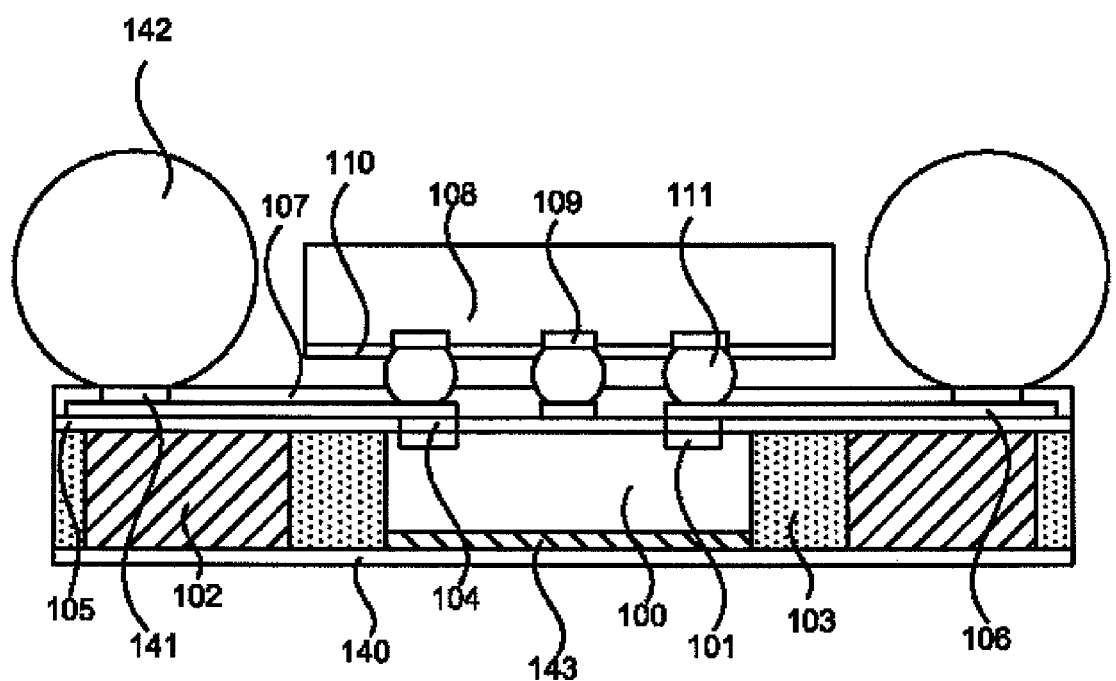
FIG. 4 illustrates a cross-sectional view of a three-dimensional System-In-Package (SiP) Package-On-Package (POP) structure with upside signal channels in accordance with one embodiment of the present invention.

FIG. 4 illustrates a cross-sectional view of a three-dimensional System-In-Package (SiP) Package-On-Package (POP) structure with upside signal channels in accordance with one embodiment of the present invention. In this embodiment, the first packaged electronic element further comprises solder bump/ball pads 141, solder bumps/balls 142, a die attach 143 and a protective layer 140. The die attach 143 is formed under the first die 100 at a predetermined thickness. The die attach 143 is an adhesion material (for example copper paste), a metal containing substrate or ceramics containing substrate for facilitating heat conduction. In one embodiment, bottom surface of the support element 102, the filling material 103 and the die attach 143 are coplanar. The protective layer 140 is formed under the die attach 143, the support element 102 and the filling material 103 for protection. In one embodiment, the material of the protective layer 140 could be the same as the support element 102. In other words, the protective layer 140 and the support element 102 can be formed by an identical process. Such embodiment, without electrical conduction downwardly, the protective layer 140 serves as bottom substrate for enhancing shielding effect and the package structural strength. The solder bumps/balls 142 are formed (located) on the solder bump/ball pads 141 for signal connection. Most of the parts of the FIG. 4 are similar to FIG. 1, and therefore the detailed descriptions are omitted. In such embodiment, the protective layer 107 is formed over the signal channels 106 for protection and covering the signal channels 106 and the dielectric layer 105 to form a plurality of openings for exposing the first end and the second end of the signal channels 106. The first end of the signal channels 106 is connected to the conductive elements 111 and the connecting layer 104, and the second end of the signal channels 106 is connected to the solder bump/ball pads 141. The solder bump/ball pads 141 are formed on the second end of the signal channels 106.

Figure 5:
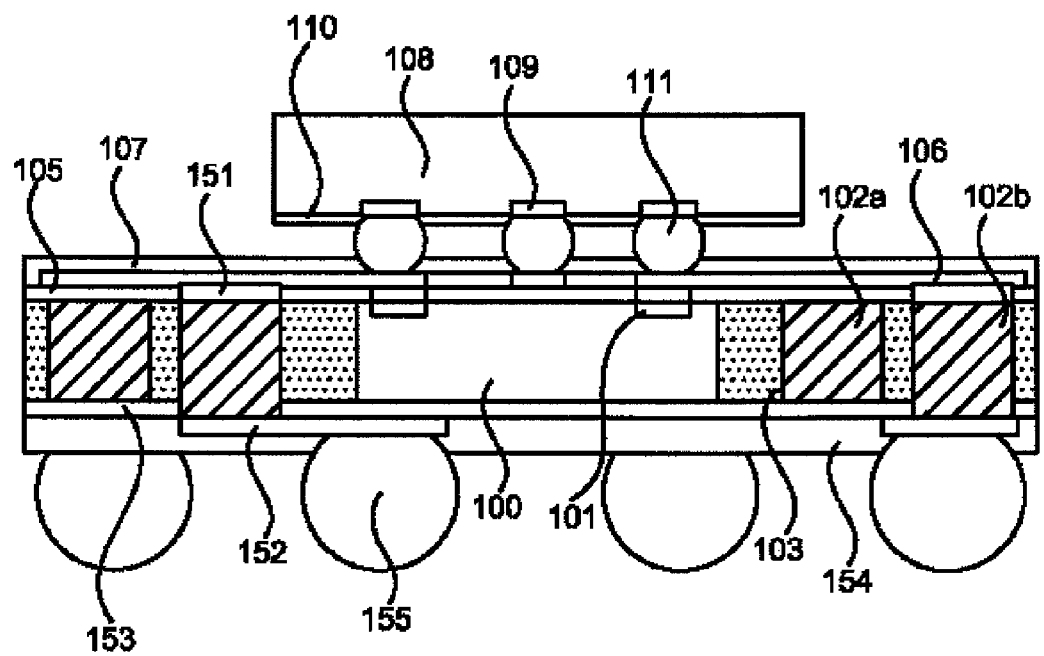
FIG. 5 illustrates a cross-sectional view of a three-dimensional System-In-Package (SiP) Package-On-Package (POP) structure with backside signal channels in accordance with one embodiment of the present invention.

FIG. 5 illustrates a cross-sectional view of a three-dimensional System-In-Package (SiP) Package-On-Package (POP) structure with backside signal channels in accordance with one embodiment of the present invention. In this embodiment, the first packaged electronic element further comprises backside signal channels 152, a connecting layer 151, solder bumps/balls 155, a dielectric layer 153 and a protective layer 154. The dielectric layer 153 is formed under the first die 100, first part of the support element 102a and the filling material 103 at a predetermined thickness. In one embodiment, bottom surface of second part of the support element 102b and lower surface of the dielectric layer 153 are coplanar. The backside signal channels 152 is formed under the second part of the support element 102b and the dielectric layer 153 to connect second part of the support element 102b. The protective layer 154 is formed under the dielectric layer 153 for protection and covering the backside signal channels 152 and the dielectric layer 153 to form a plurality of openings for exposing the backside signal channels 152. The solder bumps/balls 155 are formed (located) under the protective layer 154 and the backside signal channels 152 for connecting to the backside signal channels 152 for signal connection. Most of the parts of FIG. 5 are similar to FIG. 1, and therefore reference may be made to FIG. 1 for the detailed description of the parts of the three-dimensional Package-On-Package structure of FIG. 5. In such embodiment, the dielectric (buffer) layer 105 is formed over the first die 100, the support element 102 and the filling material 103 to create a plurality of openings for exposing the die pads 101 of the first die 100 and the upper surface of the support element 102, and thereby the connecting layer 151 forming on (connecting to) the die pads 101 of the first die 100 and the upper surface of the support element 102.

It should be noted that the thickness of protective layer (film) is preferably around 0.1 um to 0.3 um and the reflection index close to the air reflection index 1. The materials of protective layer can be silicone rubber, elastic material, photosensitive material, dielectric material, SiO2, Al2O3, glass, alloy, metal or ceramic.

The electronic device penetrates through the support element, and therefore the thickness of the die package is reduced. The package of the present invention will be thinner than the prior art. Further, the support element is pre-prepared before package. The die through hole and the filling through holes are pre-determined as well. Thus, the throughput will be improved.

Hence, the advantages of the present invention are:

The support element is pre-prepared with a pre-form through hole; it can generate the super thin package due to die insert inside the electronic device; and it can be used as a stress buffer releasing area by filling with silicone rubber to absorb the thermal stress due to the CTE difference between silicon die (CTE~2.3) and the support element. The packaging throughput will be increased (manufacturing cycle time was reduced) due to application of the simple process. The reliability for both package and board level is better than ever, so no thermal mechanical stress can be applied on the solder bumps/balls. The cost is low and the process is simple. The manufacturing process can be fully automatically applied especially in module assembly. It is easy to form the combo package (dual dice package). It has high yield rate due to particles free, simple process, and full automation.

Although preferred embodiments of the present invention have been described, it will be understood by those skilled in the art that the present invention should not be limited to the described preferred embodiments. Rather, various changes and modifications can be made within the spirit and scope of the present invention, as defined by the following claims.

Having described the invention, the following is claimed:

1. A three-dimensional package structure, comprising:
   at least one first electronic device with first die pads;
   a support element formed around said at least one first electronic device;
   a filling material filled between said at least one first electronic device and said support element, wherein top surfaces of said at least one first electronic device, said support element and said filling material are coplanar;
   a dielectric layer formed on said at least one first electronic device, said support element and said filling material to expose said first die pads;
   signal channels formed over said dielectric layer for coupling to said first die pads;
   a first protective layer formed over said signal channels to expose the first end of said signal channels;
   conductive elements formed on said first end of said signal channels;
   a second electronic device with second die pads coupled to said conductive elements;
   a second protective layer formed under said second electronic device to expose said second die pads of said second electronic device;
   a second dielectric layer formed under said first electronic device, said support element and said filling material;
   a third protective layer formed under said second dielectric layer;
   a second support element formed around said at least one first electronic device;
   backside signal channels formed under said second dielectric layer for connecting to said second support element;
   solder balls formed under said third protective layer and said backside signal channels for connecting to said backside signal channels; and
   a connecting layer formed on said first die pads and said second support element, and under said signal channels.

2. The structure of claim 1, further comprising a connecting layer formed between said signal channels and said first die pads.

3. The structure of claim 2, wherein said connecting layer includes conductive material.

4. The structure of claim 1, wherein said support element includes conductive material.

5. The structure of claim 1, further comprising a substrate with terminal pads formed thereon, and an adhesive layer formed over said substrate and under said at least one first electronic device, said support element and said filling material.

6. The structure of claim 5, further comprising bonding pads formed on the second end of said signal channels wherein said bonding pads are electrically connected to said terminal pads through wire bonds.

7. The structure of claim 6, further comprising a molding material for encapsulating said first electronic device, said second electronic device and said wire bonds on said substrate.

8. The structure of claim 7, further comprising second conductive elements formed under said substrate.

9. The structure of claim 5, wherein said adhesive layer comprises conductive material, glue material, ceramic material or copper paste.

10. The structure of claim 1, further comprising ball pads formed on the second end of said signal channels wherein said ball pads are electrically connected to solder balls.

11. The structure of claim 10, further comprising a die attach formed under said first electronic device.

12. The structure of claim 11, further comprising a third protective layer formed under said die attach, said support element and said filling material.

13. The structure of claim 12, wherein material of said third protective layer comprises silicone rubber, glass, alloy, metal or ceramic.

14. The structure of claim 12, wherein said third protective layer comprises elastic material, photosensitive material or dielectric material.

15. The structure of claim 1, wherein bottom surface of said second support element and lower surface of said second dielectric layer are coplanar.

16. The structure of claim 1, further comprising a second signal channels formed under said second electronic device and coupling between said second die pads and said conductive elements.

* * * * *